United States Patent [19]

Asakura et al.

[11] Patent Number: 5,732,034
[45] Date of Patent: Mar. 24, 1998

[54] SEMICONDUCTOR MEMORY DEVICE HAVING AN ADDRESS KEY CIRCUIT FOR REDUCING POWER CONSUMPTION

[75] Inventors: Mikio Asakura; Tadaaki Yamauchi; Takashi Ito, all of Hyogo, Japan

[73] Assignee: Mitsubishi Denki Kabushiki Kaisha, Tokyo, Japan

[21] Appl. No.: 759,200

[22] Filed: Dec. 4, 1996

[30] Foreign Application Priority Data

May 29, 1996 [JP] Japan ................................. 8-134779

[51] Int. Cl.$^6$ ................................................ G11C 7/00
[52] U.S. Cl. ...................... 365/201; 365/191; 365/230.08
[58] Field of Search ................................ 365/201, 191, 365/230.08, 230.06

[56] References Cited

U.S. PATENT DOCUMENTS

| | | | |
|---|---|---|---|
| 4,507,761 | 3/1985 | Graham | 365/230 |
| 4,609,985 | 9/1986 | Dozier | 365/200 |
| 4,618,947 | 10/1986 | Tran et al. | 365/230 |
| 4,958,345 | 9/1990 | Fujisaki | 371/21.3 |
| 5,596,537 | 1/1997 | Sukegawa et al. | 365/201 |

FOREIGN PATENT DOCUMENTS 2-186668  7/1990  Japan.

*Primary Examiner*—David C. Nelms
*Assistant Examiner*—Hien Nguyen
*Attorney, Agent, or Firm*—Lowe, Price, LeBlanc & Becker

[57] ABSTRACT

An input first stage is used for inputting both addresses and address keys. A test mode setting circuit and a function setting circuit are disposed between the input first stage and an address buffer. Each function setting mode buffer latches an internal address signal when a signal/RAS falls. Further, a function signal generating circuit is initialized by a power-on reset signal when a power supply is turned on.

4 Claims, 7 Drawing Sheets

SEMICONDUCTOR MEMORY DEVICE HAVING AN ADDRESS KEY CIRCUIT FOR REDUCING POWER CONSUMPTION

CROSS-REFERENCE TO RELATED APPLICATIONS

This application is related to copending application Ser. No. 08/623.803, filed on Mar. 29, 1996, commonly assigned with the present invention.

BACKGROUND OF THE INVENTION

1. Field of the Invention

The present invention relates to a semiconductor memory device and, more particularly, to a semiconductor memory device having a normal operation mode, a test mode, and a function setting mode which can selectively set an operation method in the normal operation mode.

2. Description of the Background Art

Figure 8:
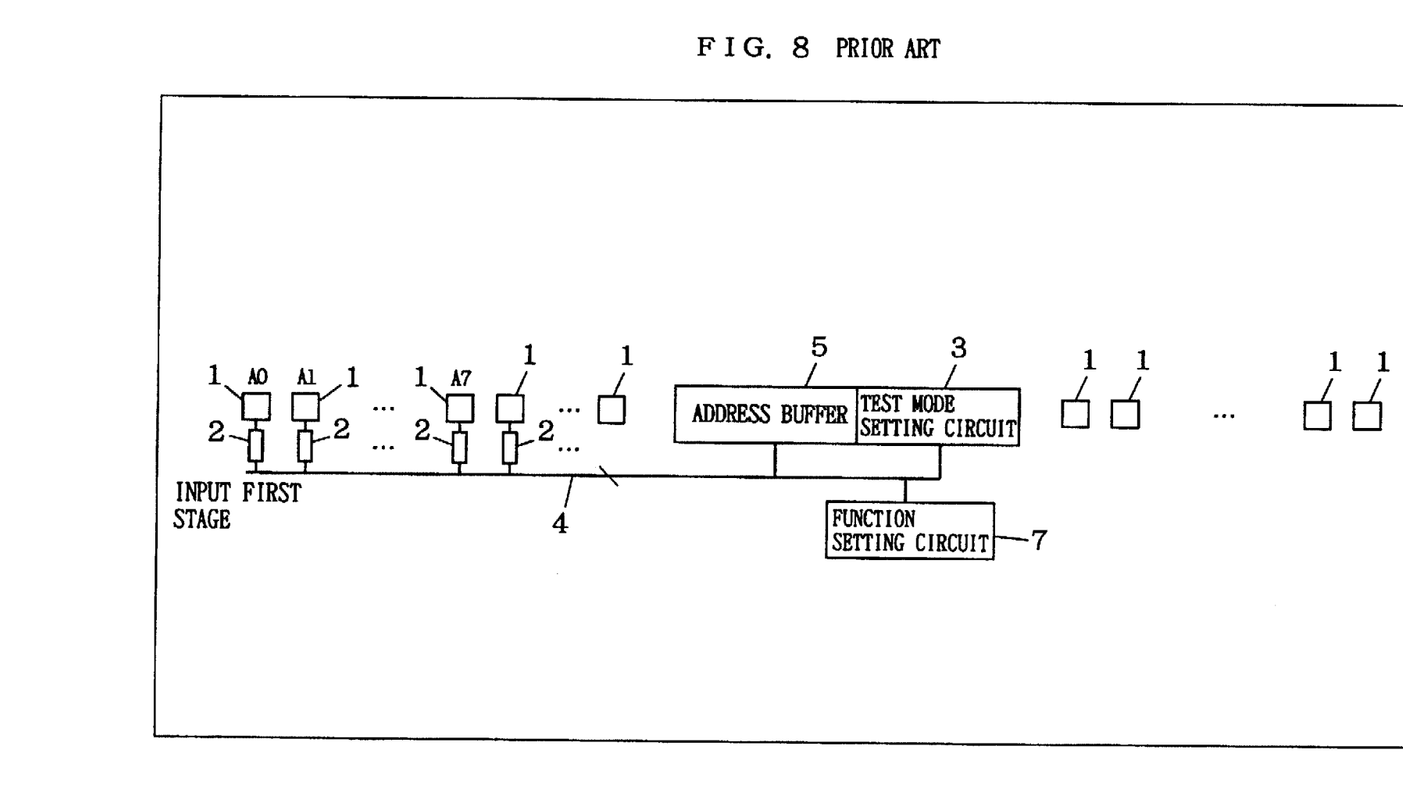
FIG. 8 shows an overall structure of a conventional semiconductor memory device.

FIG. 8 shows an overall structure of a conventional semiconductor memory device having a normal operation mode, a test mode, and a function setting mode.

As shown in FIG. 8, this semiconductor memory device adopts the LOC (Lead On Chip) structure. Beside each address pad 1, an input first stage 2 is disposed. All input first stages 2 are connected by a signal line bundle 4 to a test mode setting circuit 3, an address buffer 5, and a function setting circuit 7 which are in the central part.

Figure 9:
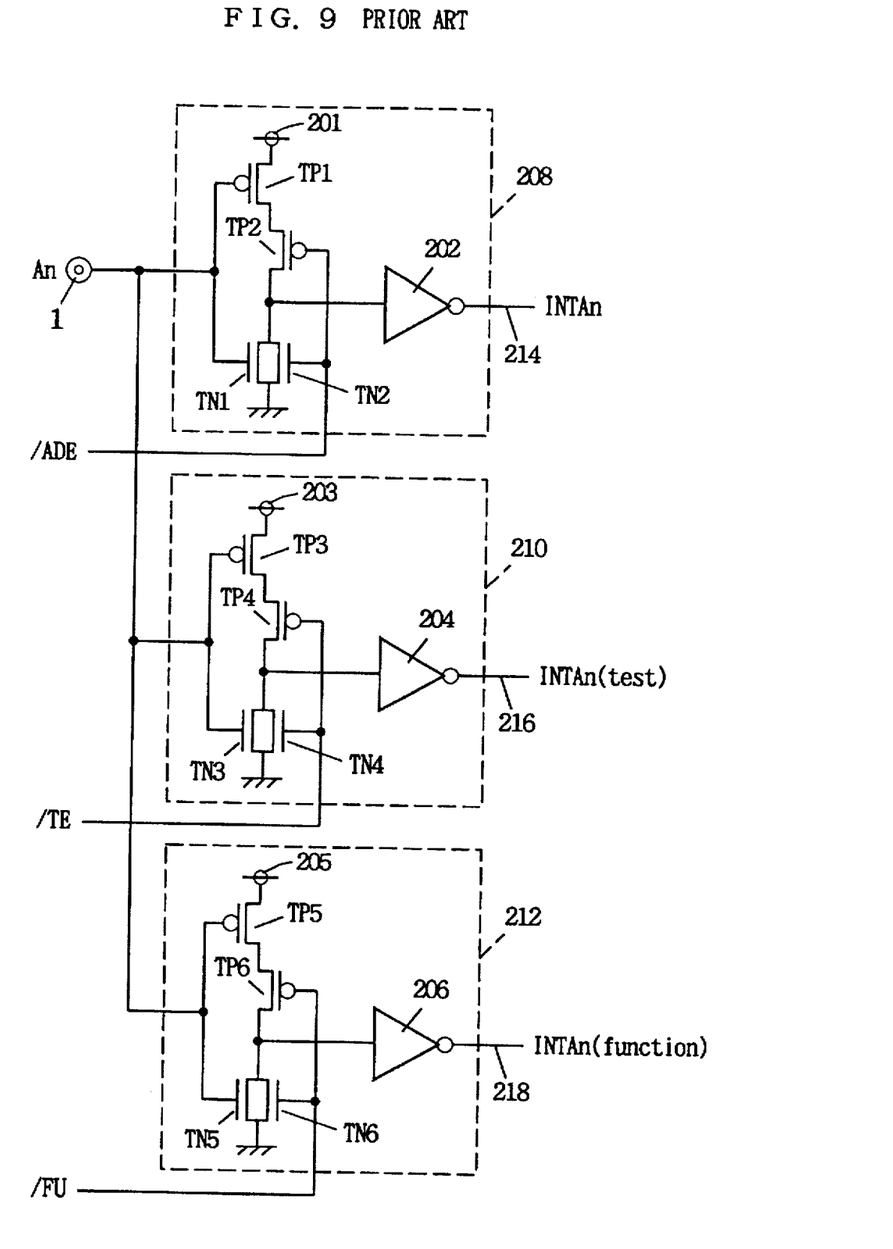
FIG. 9 is a circuit diagram showing a specific structure of an input first stage shown in FIG. 8.

A specific structure of input first stage 2 is shown in a circuit diagram of FIG. 9. As shown in FIG. 9, input first stage 2 includes an address input portion 208, a test mode input portion 210, and a function setting mode input portion 212 which are connected to address pad 1.

This address input portion 208 is activated by receiving a low level (hereinafter an "L level", a high level is also referred to as an "H level") address enable signal/ADE, and it outputs an internal address signal INTAn in response to an address signal An which is input to address pad 1. Test mode input portion 210 is activated by receiving an L level test enable signal/TE, and it outputs an internal test signal INTAn(test) in response to the address signal An which is input to address pad 1. In the same manner, function setting mode input portion 212 is activated by receiving an L level function enable signal/FU, and it outputs an internal function signal INTAn(function) in response to the address signal An which is input to address pad 1.

However, several problems arise in the above-described semiconductor memory device. First, the total number of signal lines is too great in the semiconductor memory device because three signal lines 214, 216, and 218 from each input first stage 2 are connected, as shown in FIG. 8 and FIG. 9, to address buffer 5, test mode setting circuit 3, and function setting circuit 7, respectively. Secondly, input capacitance of address pad 1 is too large. That is because address input portion 208, test mode input portion 210, and function setting mode input portion 212 are connected in parallel to address pad 1 as shown in FIG. 9.

Lastly, highly accurate circuit design is required for address input portion 208 and user-controllable function setting mode input portion 212 which are shown in FIG. 9, because they need to satisfy a given specification with respect to external voltage input levels.

SUMMARY OF THE INVENTION

An object of the present invention is to provide a small-sized and easily designable semiconductor memory device having an address key circuit for reducing power consumption.

According to one aspect of the present invention, a semiconductor memory device has a normal operation mode and a non-normal operation mode and includes a plurality of pads for receiving an external address signal, a plurality of input terminals for receiving an external control signal, a mode detecting circuit responsive to the external control signal from the input terminals for detecting the occurrence of the non-normal operation mode, a plurality of internal address signal generating circuits each connected to a corresponding one of the pads and responsive to the external address signal for generating an internal address signal, an address latching circuit responsive to the external control signal for latching the internal address signal, and a mode setting circuit responsive to the internal address signal for generating a non-normal operation mode determining signal to determine the non-normal operation mode when the above-described mode detecting circuit detects the occurrence of the non-normal operation mode.

According to another aspect of the present invention, a semiconductor memory device has a normal operation mode and a non-normal operation mode and includes a plurality of pads for receiving an external address signal, a plurality of input terminals for receiving an external control signal, a mode detecting circuit responsive to the external control signal from the input terminals for detecting the occurrence of the non-normal operation mode, a plurality of internal address signal generating circuits responsive to the external address signal for generating an internal address signal, an address latching circuit responsive to the external control signal for latching the internal address signal, and a mode setting circuit. The mode setting circuit is disposed between the internal address signal generating circuit and the address latching circuit and it generates a non-normal operation mode determining signal for determining the non-normal operation mode in response to the internal address signal when the mode detecting circuit detects the occurrence of the non-normal operation mode.

According to still another aspect of the present invention, a semiconductor memory device can selectively set an operation method in a normal operation mode and includes a mode control signal generating circuit responsive to an external control signal for generating a mode control signal to set the above-described operation method, an internal address signal generating circuit responsive to an external address signal for generating an internal address signal, a power-on reset signal generating circuit generating and outputting an activated power-on reset signal for a prescribed time period after a power supply is turned on in the above-described semiconductor memory device, a function signal generating circuit responsive to the internal address signal for generating a function determining signal to determine the setting of the above-described operation method when the mode control signal is generated by the mode control signal generating circuit. The function signal generating circuit includes a latching circuit responsive to the activated power-on reset signal for latching data for outputting a function determining signal having a prescribed logic level from the function signal generating circuit.

According to still another aspect of the present invention, a semiconductor memory device can selectively set an operation method in a normal operation mode and includes a mode control signal generating circuit responsive to an external control signal for generating a mode control signal to set the above-described operation method, an internal address signal generating circuit responsive to an external address signal for generating an internal address signal, an operation method setting buffer responsive to the internal address signal for generating and outputting an operation method setting address signal, a function signal generating circuit responsive to the operation method setting address signal for generating and outputting a function determining signal to determine the setting of the operation method. The operation method setting buffer includes a first latching circuit responsive to the above-described external control signal for latching the internal address signal and a second latching circuit responsive to the mode control signal generated by the mode control signal generating circuit for latching a signal from the first latching circuit.

Therefore, according to an advantage of the present invention, a semiconductor memory device can be miniaturized by reducing the number of wirings, and circuits are easily designed. In addition, power consumption is reduced by making smaller the input capacitance of pads.

According to another advantage of the present invention, a signal line can be shortened which connects the internal address signal generating circuit and the mode setting circuit. Power consumption is also reduced by lessening parasitic capacitance to this signal line.

According to still another advantage of the present invention, erroneous handling of the operators can be avoided when an operation method in a normal operation mode is initialized.

According to still another advantage of the present invention, each external address signal is quickly supplied from the outside to determine an operation method in a normal mode, and the above-described operation method can be easily determined.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

An embodiment of the present invention will now be described in detail with reference to the accompanying drawings. The same numerals refer to the same or equivalent parts throughout the drawings.

Figure 1:
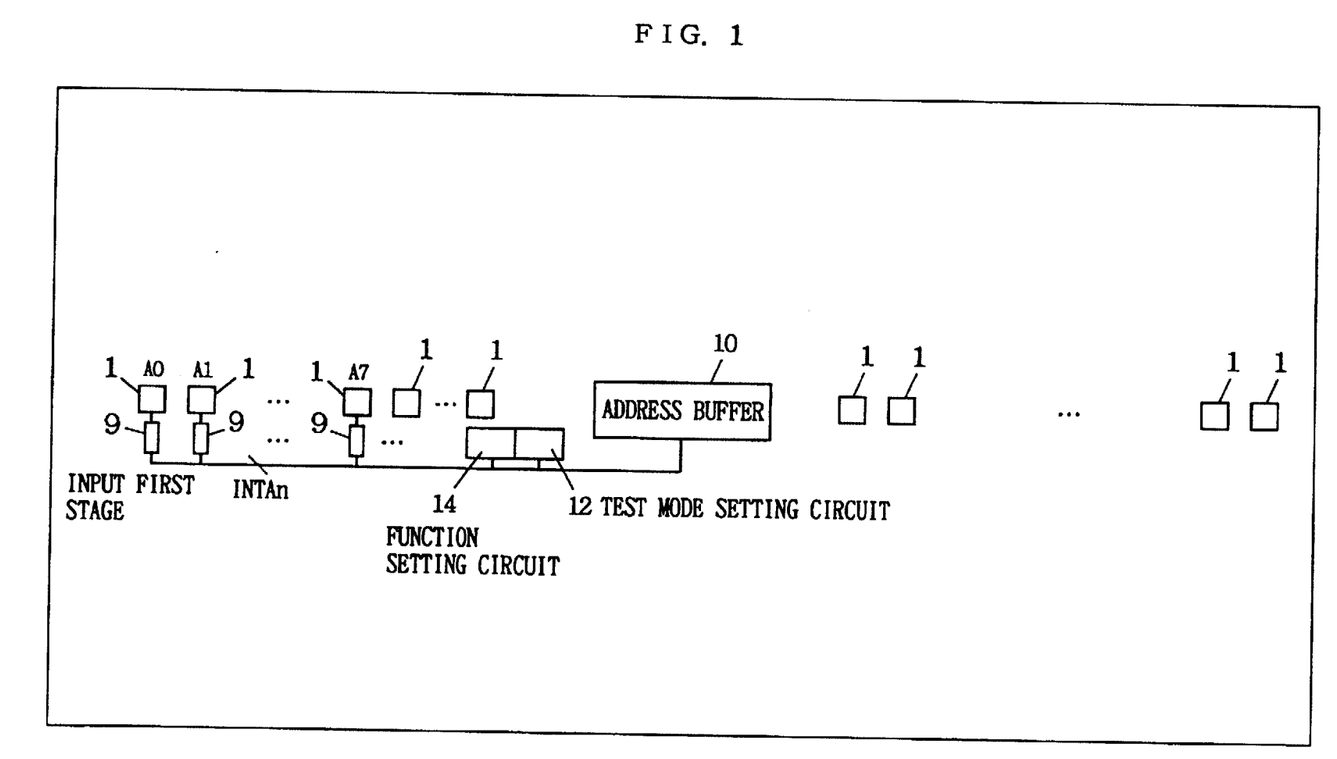
FIG. 1 shows an overall structure of a semiconductor memory device in accordance with an embodiment of the present invention.
Figure 3:
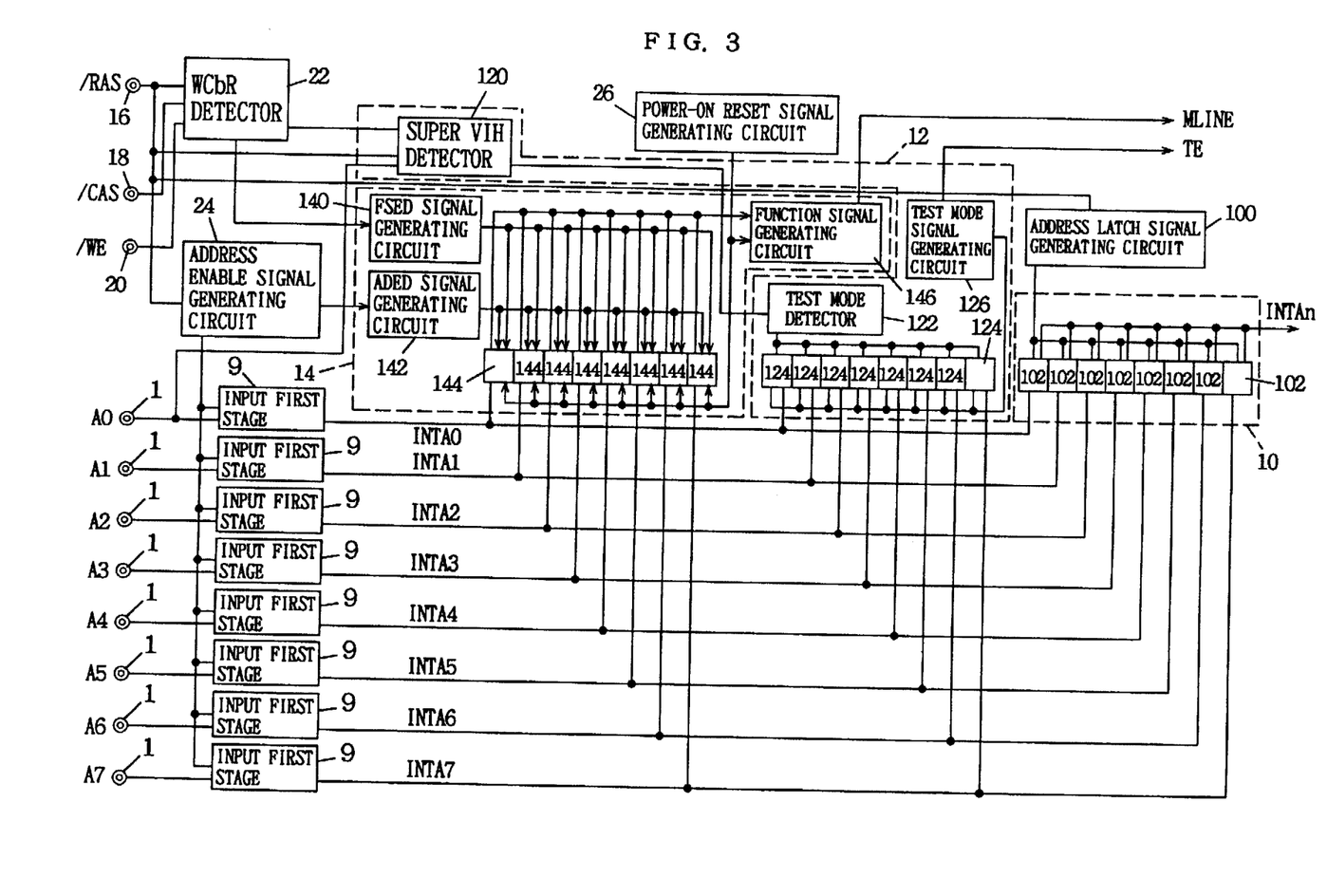
FIG. 3 shows a specific structure of the semiconductor memory device shown in FIG. 1.

FIG. 1 shows an overall structure of a semiconductor memory device in accordance with the embodiment of the present invention. A more specific structure is illustrated in FIG. 3. This semiconductor memory device includes a dynamic random access memory (DRAM) and it has a normal operation mode, a test mode, and a function setting mode.

In the embodiment, a test mode refers to a mode which is not open to users and it is entered by WCbR timing+super VIH+an address key.

Here, the WCbR timing denotes the timing when a row address strobe signal/RAS which is input to an input terminal 16 shown in FIG. 3 falls after the fall of a column address strobe signal/CAS and of a write enable signal/WE which are input to input terminals 18, 20 respectively.

The super VIH denotes a voltage higher than input voltage in normal operation in the semiconductor memory device having a DRAM.

The address key denotes a given combination of amplitudes of external address signals A0–An (in the following description, n=3 for a test mode and n=7 for a function setting mode) which are input to address pads 1. The embodiment of the present invention has two kinds of test modes which are entered by the address keys (A0, A1, A2, A3)=(1, 0, 0, 0), (1, 0, 1, 1).

Meanwhile, the function setting mode is open to users (it is an user-controllable mode) and entered by WCbR timing+ an address key. The embodiment has two kinds of functions which are entered by the address keys (A0, A1, A2, A3, A4, A5, A6, A7)=(0, 0, 0, 0, 0, 1, 0, 0), (1, 0, 0, 0, 0, 1, 0, 0). These functions include, for example, a function which determines how a burst address is provided in a burst EDO mode.

A semiconductor memory device in accordance with the present embodiment which has the above-described test mode, function setting mode, and normal operation mode is organized as follows.

As shown in FIG. 1, the semiconductor memory device has the same structure as the one shown in FIG. 8. However, it differs from the conventional semiconductor memory device in that a test mode setting circuit 12 and a function setting circuit 14 which serve as a buffer holding address keys received at address pads 1 are disposed between input first stages 9 and an address buffer 10.

Figure 2:
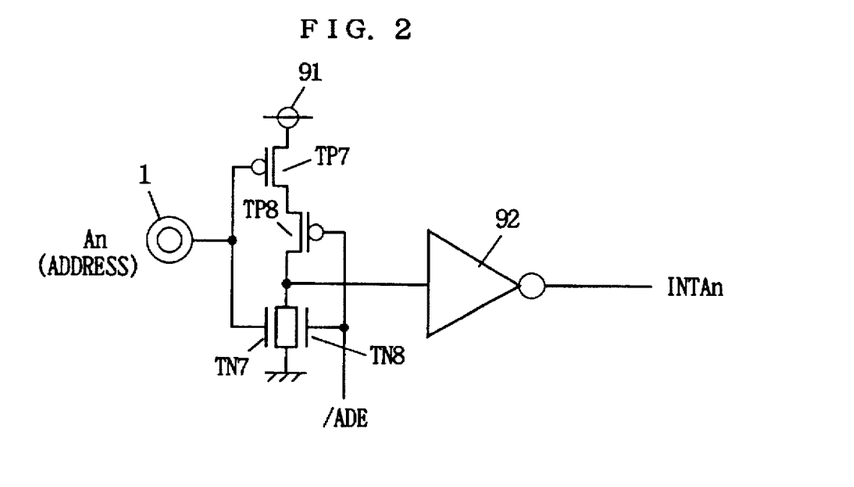
FIG. 2 is a circuit diagram showing a specific structure of an input first stage shown in FIG. 1.

Other differences are also found in circuit design of input first stage 9 which is illustrated in detail in FIG. 2. That is, this input first stage 9 is constructed by integrating an address input portion 208, a test mode input portion 210, and a function setting mode input portion 212 and it has the same structure as the above-described address input portion 208. Specifically, input first stage includes a power supply node 91, p channel MOS transistors TP7 and TP8, n channel MOS transistors TN7 and TN8, and an inverter 92. These p channel MOS transistor TP8 and n channel MOS transistor TN 8 are supplied with an address enable signal/ADE at their gates. Activation of this address enable signal/ADE activates input first stage 9, and inverter 92 outputs an internal address signal INTAn (n=0 to 7) in response to an external address signal An (n=0 to 7) which is input to address pad 1.

As described above, functions of receiving an external address signal in normal operation, an address key for test modes, and an address key for function setting modes of conventional input first stage 2 are integrated by a simplified circuitry. Therefore, input capacitance of address pad 1 is reduced.

In addition, reduction of circuit elements being used facilitates designing a circuit of input first stage 9 satisfying a specification of address keys which are open to users.

A semiconductor memory device in accordance with the embodiment will be now described more specifically.

As shown in FIG. 3, this semiconductor memory device includes address pads 1, input first stages 9 connected to address pads 1, an address buffer 10, a test mode setting circuit 12 outputting a test signal TE for entering a test mode, a function setting circuit 14 outputting a function signal MLINE for determining a function, an input terminal 16 for inputting a row address strobe signal/RAS, an input terminal 18 for inputting a column address strobe signal/CAS, an input terminal 20 for inputting a write enable signal/WE, a WCbR detector 22 connected to input terminals 16, 18, and 20, an address enable signal generating circuit 24 connected to input terminal 16 and responsive to the row address strobe signal/RAS which is input from input terminal 16 for generating an address enable signal/ADE, and a power-on reset signal generating circuit 26.

Figure 4:
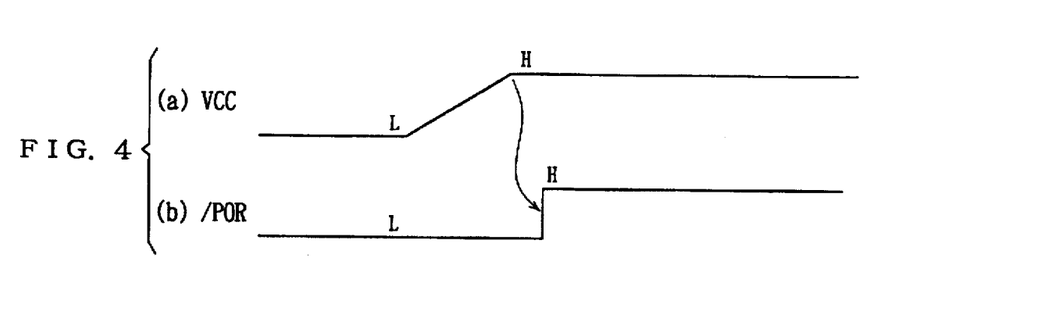
FIG. 4 is a timing chart showing operation of a power-on reset signal generating circuit shown in FIG. 3.

In the embodiment, power-on reset signal generating circuit 26 generates an activated power-on reset signal/POR of an L level until the level of power supply voltage VCC completely reaches an H level as shown in a timing chart of FIG. 4 after a power supply is turned on. WCbR detector 22 receives the row address strobe signal/RAS, the column address strobe signal/CAS and the write enable signal/WE and outputs a signal indicating whether these signals are at WCbR timing.

Address latch signal generating circuit 100 receives the row address strobe signal/RAS to generate an address latch signal instructing to latch an internal address signal INTAn (n=0 to 7). The above-described address buffer 10 includes an address latching portion 102 latching the internal address signal INTAn (n=one of 0 to 7) being input, by receiving the above-described address latch signal.

Test mode setting circuit 12 includes a super VIH detector 120, a test mode detector 122, an address latching portion 124 for test modes, and a test mode signal generating circuit 126.

In test mode setting circuit 12, super VIH detector 120 receives the row address strobe signal/RAS, a signal being output from WCbR detector 22 and indicating that the WCbR timing is generated, and an external address signal A0. Super VIH detector 120 outputs an H level (5V in the above example) signal SV to test mode detector 122 when a signal indicating the occurrence of the above-described WCbR timing is input to super VIH detector 120 and when potential of the external address signal A0 is super VIH (for example, 8V when power supply potential is 5V).

Receiving the above-described signal SV, test mode detector 122 generates a signal instructing to latch the internal address signal INTAn (n=0 to 7) and it outputs the signal to each address latching portion 124 for test modes.

Each address latching portion 124 for test modes latches, in response to the signal which is output from test mode detector 122, the corresponding internal address signal INTAn (N=one of 0 to 7).

Test mode signal generating circuit 126 generates and outputs a test mode signal TE based on the internal address signal INTAn (n=0 to 7) which is latched by address latching portion 124 for test modes.

Meanwhile, function setting circuit 14 includes a FSED signal generating circuit 140 connected to WCbR detector 22, an ADED signal generating circuit 142 connected to address enable signal generating circuit 24, a function setting mode buffer 144 connected to FSED signal generating circuit 140 and to ADED signal generating circuit 142, and a function signal generating circuit 146 connected to function setting mode buffer 144 and to power-on reset signal generating circuit 26.

In function setting circuit 14, FSED signal generating circuit 140 generates and outputs, in response to a signal indicating generation of the WCbR timing, a FSED signal consisting of an one-shot pulse after T time since the row address strobe signal/RAS is activated. ADED signal generating circuit 142 generates and outputs, in response to an address enable signal generated by address enable signal generating circuit 24, an ADED signal consisting of an one-shot pulse when the row address strobe signal/RAS is activated.

Figure 5:
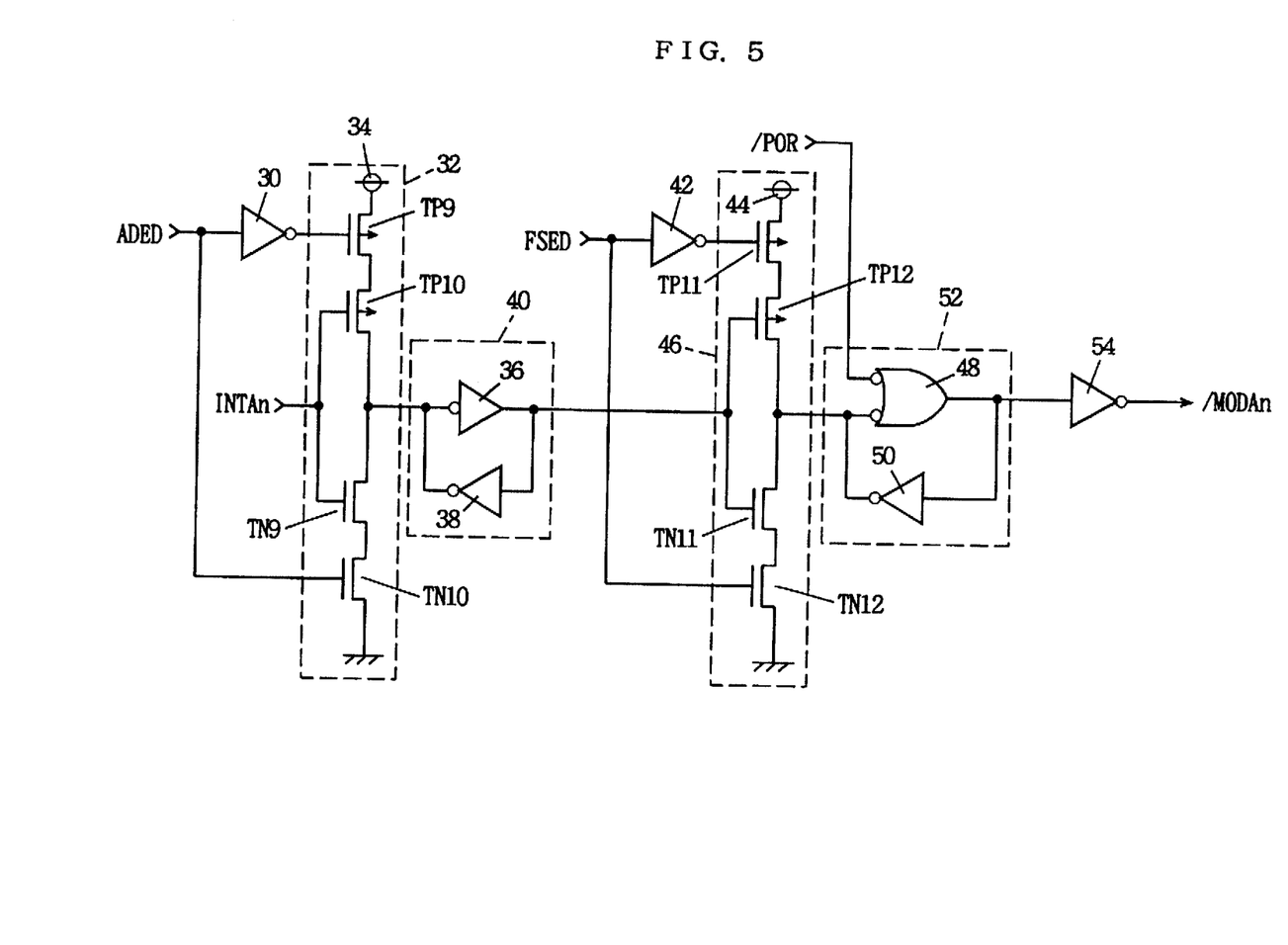
FIG. 5 is a circuit diagram showing a specific structure of a function setting mode buffer shown in FIG. 3.

FIG. 5 is a circuit diagram showing a specific structure of a function setting mode buffer 144. As shown in FIG. 5, this function setting mode buffer 144 includes an inverter 30 inverting the ADEA signal being input, a first stage clocked inverter 32 being controlled by the ADED signal and inverting the internal address signal INTAn (n=one of 0 to 7), a first stage latching circuit 40 latching data which is output from first stage clocked inverter 32, an inverter 42 inverting the FSED signal being input, a second stage clocked inverter 46 controlled by the FSED signal, a second stage latching circuit 52 latching data based on a signal which is output from second stage clocked inverter 46 and on the power-on reset signal/POR, and inverter 54 inverting a signal which is output from second latching circuit 52 outputting a signal/MODAn.

Operation of this function setting mode buffer 144 will now be described with reference to a timing chart of FIG. 6.

Figure 6:
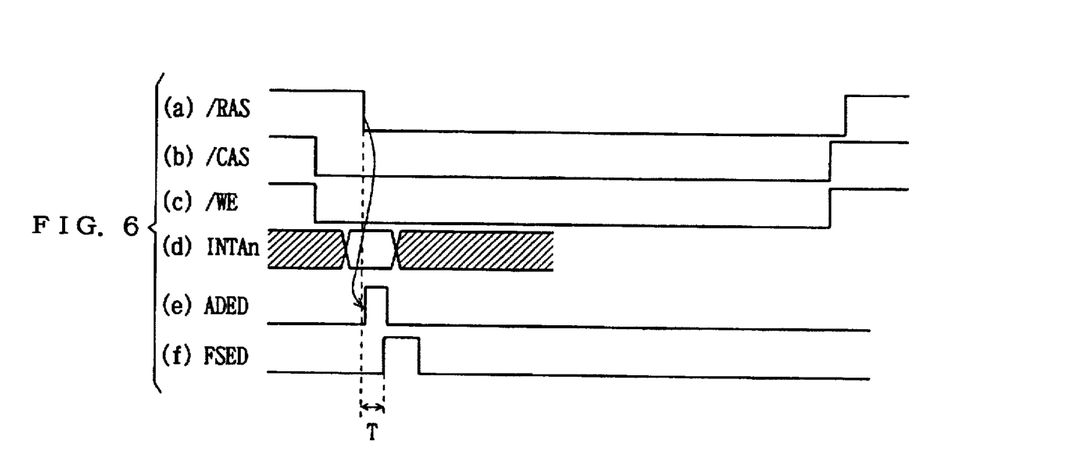
FIG. 6 is a timing chart showing operation of the function setting mode buffer shown in FIG. 5.

When a row address strobe signal/RAS falls as shown in (a) of FIG. 6, ADED signal generating circuit 142 receives a signal which is output from address enable signal generating circuit 24 and generates the ADED signal which, as described above, consists of an one-shot pulse shown in (e) of FIG. 6. This signal is supplied to inverters 30 and a gate of n channel MOS transistor TN10 shown in FIG. 5 and it is activated by first stage clocked inverter 32. Accordingly, the internal address signal INTAn (n=0 to 7) which is input at this activated timing as shown in (d) of FIG. 6 is latched by first stage latching circuit 40.

When the so called WCbR timing occurs where the row address strobe signal/RAS falls after the fall of column address strobe address signal/CAS and of the write enable signal/WE as shown in (a), (b), and (c) of FIG. 6, FSED signal generating circuit 140 receives, as described above, a signal which is output from WCbR detector 22 and generates, as shown in (f) of FIG. 6, the FSED signal consisting of an one-shot pulse T time after the row address strobe signal/RAS falls. This FSED signal is supplied to inverter 42 and a gate of n channel MOS transistor TN12, thereby activating second stage clocked inverter 46.

Accordingly, data latched by first stage latching circuit 40 T time after the fall of the row address strobe signal RAS is inverted in its polarity and latched by second latching circuit 52. Since a NAND circuit 48 included in second stage latching circuit 52 is supplied with an activated power-on reset signal/POR of an L level when the power supply is turned on, inverter 54 always outputs an activated L level signal/MODAn (n=one of 0 to 7).

According to the function setting mode buffer 144 described above, the internal address signal INTAn (n=one of 0 to 7) is latched immediately after the fall of the row address strobe signals/RAS. Therefore, the time required for supplying external address signals A0–A7 to address pads 1 is shorter than when the FSED signal controls the first stage latching circuit to latch the internal address signal INTAn (n=one of 0 to 7), and desired specification is also satisfied. Further, address keys can be set at the WCbR timing in a shorter period of time.

Figure 7:
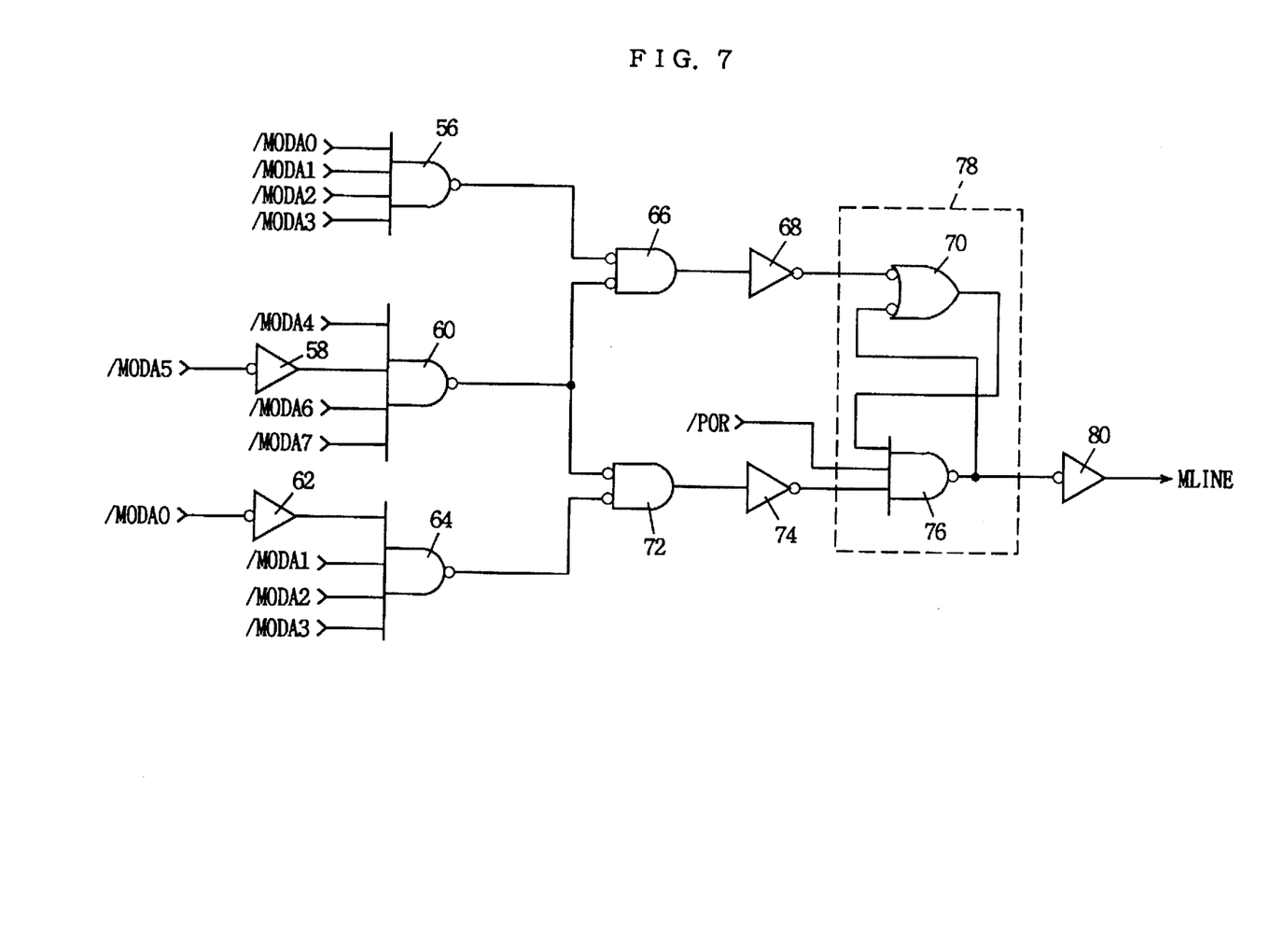
FIG. 7 is a circuit diagram showing a specific structure of a function signal generating circuit shown in FIG. 3.

FIG. 7 is a circuit diagram showing a specific structure of function signal generating circuit 146 shown in FIG. 3. As shown in FIG. 7, this function signal generating circuit 146 includes a NAND circuit 56 receiving signals/MODA0-3 which are output from the above-described function setting mode buffer 144, an inverter 58, a NAND circuit 60 receiving signals/MODA4, 6, and 7 and an inverted signal of a signal/MODA5, an inverter 62, an NAND circuit 64 receiving an inverted signal of a signal/MODA0 and signals MODA1-3, a NOR circuit 66 receiving signals output from NAND circuits 56 and 60, a NOR circuit 72 receiving signals output from NAND circuits 60 and 64, inverters 68, 74, and 80, and a latching circuit 78.

In function signal generating circuit 146, when external address signals (A0, A1, A2, A3, A4, A5, A6, A7)=(0, 0, 0, 0, 0, 1, 0, 0) are input to address pads 1 as an address key, inverter 80 outputs an H level function signal MLINE. When external address signals (A0, A1, A2, A3, A4, A5, A6, A7)=(1, 0, 0, 0, 0, 1, 0, 0) are input to address pads 1, inverter 80 outputs an L level function signal MLINE. Among two functions determined by this H or L level function signal MLINE, a function used by larger number of users is assumed to be the one determined by the external address signals (A0, A1, A2, A3, A4, A5, A6, A7)=(1, 0, 0, 0, 0, 1, 0, 0).

In this case, since the power-on reset signal/POR is input to NAND circuit 76 included in latching circuit 78, inverter 80 always outputs an L level function signal MLINE when the power supply is turned on. Therefore, a function used by larger number of users as described above is automatically set when the power supply is turned on.

According to such a function signal generating circuit 146, erroneous handling to set an address key can be reduced when the power supply is turned on.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal operation mode and a non-normal operation mode, comprising:

a plurality of pads for receiving an external address signal;

a plurality of input terminals for receiving an external control signal;

mode detecting means responsive to said external control signal from said input terminals for detecting occurrence of said non-normal operation mode;

a plurality of internal address signal generating means each connected to a corresponding one of said pads and responsive to said external address signal for generating an internal address signal;

address latching means responsive to said external control signal for latching said internal address signal; and mode setting means responsive to said internal address signal for generating a non-normal operation mode determining signal to determine said non-normal operation mode when the occurrence of said non-normal operation mode is detected by said mode detecting means.

2. A semiconductor memory device having a normal operation mode and a non-normal operation mode, comprising:

a plurality of pads for receiving an external address signal;

a plurality of input terminals for receiving an external control signal;

mode detecting means responsive to said external control signal from said input terminals for detecting occurrence of said non-normal operation mode;

a plurality of internal address signal generating means responsive to said external address signal for generating an internal address signal;

address latching means responsive to said external control signal for latching said internal address signal; and mode setting means disposed between said internal address signal generating means and said address latching means and responsive to said internal address signal for generating a non-normal operation mode determining signal to determine said non-normal operation mode when the occurrence of said non-normal operation mode is detected by said mode detecting means.

3. A semiconductor memory device capable of selectively setting an operation method in a normal operation mode, comprising:

mode control signal generating means responsive to an external control signal for generating a mode control signal to set said operation method;

internal address signal generating means responsive to an external address signal for generating an internal address signal;

power-on reset signal generating means generating and outputting an activated power-on reset signal for a prescribed time period after a power supply of said semiconductor memory device is turned on; and function signal generating means responsive to said internal address signal for generating a function determining signal to determine setting of said operation method when said mode control signal is generated by said mode control signal generating means, said function signal generating means including latching means, responsive to said activated power-on reset signal for latching data to output said function determining signal having a prescribed logic level from said function signal generating means.

4. A semiconductor memory device capable of selectively setting an operation method in a normal operation mode, comprising:

mode control signal generating means responsive to an external control signal for generating a mode control signal to set said operation method;

internal address signal generating means responsive to an external address signal for generating an internal address signal;

an operation method setting buffer responsive to said internal address signal for generating and outputting an operation method setting address signal; and function signal generating means responsive to said operation method setting address signal for generating and outputting a function determining signal to determine setting of said operation method;

wherein said operation method setting buffer includes first latching means responsive to said external control signal for latching said internal address signal, and second latching means responsive to said mode control signal generated by said mode control signal generating means for latching a signal from said first latching means.

* * * * *